US012811610B2

(12) United States Patent
Schedelbeck et al.

(10) Patent No.: US 12,811,610 B2
(45) Date of Patent: Nov. 24, 2026

(54) PMD-TO-TC-MAC INTERFACE WITH 2-STAGE FEC PROTECTION

(71) Applicant: MAXLINEAR, INC., Carlsbad, CA (US)

(72) Inventors: Gert Schedelbeck, Munich (DE); Rainer Strobel, Munich (DE); Vladimir Oksman, Morganville, NJ (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 18/896,779

(22) Filed: Sep. 25, 2024

(65) Prior Publication Data

US 2025/0023584 A1 Jan. 16, 2025

Related U.S. Application Data

(63) Continuation of application No. 18/493,579, filed on Oct. 24, 2023, now abandoned, which is a (Continued)

(51) Int. Cl.

*H03M 13/29* (2006.01)
*H03M 13/00* (2006.01)
*H03M 13/37* (2006.01)
*H03M 13/01* (2006.01)
*H03M 13/11* (2006.01)

(52) U.S. Cl.

CPC ... *H03M 13/3707* (2013.01); *H03M 13/6511* (2013.01); *H03M 13/015* (2013.01); *H03M 13/1108* (2013.01); *H03M 13/1117* (2013.01); *H03M 13/2984* (2013.01)

(58) Field of Classification Search

CPC ...................... H03M 13/3707; H03M 13/6511
See application file for complete search history.

(56) References Cited

U.S. PATENT DOCUMENTS 8,756,475 B2 * 6/2014 Chung .................. H03M 13/29
714/755
10,469,103 B1 11/2019 Jeong (Continued)

FOREIGN PATENT DOCUMENTS

CN 103733621 A 4/2014
CN 104081358 A 10/2014
CN 104115126 A 10/2014

OTHER PUBLICATIONS

International Search Report and Written Opinion in PCT/US2022/073406 mailed Oct. 20, 2022.

(Continued)

*Primary Examiner* — Joseph D Torres
(74) *Attorney, Agent, or Firm* — Buchalter; Jason W. Croft

(57) ABSTRACT

A system for a fiber-optic network includes a transceiver. The transceiver includes a fiber-optic interface unit and a host unit. The host unit includes a low-complexity error correction decoder and a high-complexity error correction decoder. One or both from the low-complexity error correction decoder and the high-complexity error correction decoder are selected to decode input data from the fiber-optic interface unit, the input data including codewords.

16 Claims, 9 Drawing Sheets

Related U.S. Application Data continuation of application No. 17/810,830, filed on Jul. 5, 2022, now Pat. No. 11,799,500.

(60) Provisional application No. 63/218,396, filed on Jul. 4, 2021.

(56) References Cited

U.S. PATENT DOCUMENTS

| | | | | | |
|---|---|---|---|---|---|
| 11,799,500 | B2 | 10/2023 | Schedelbeck et al. | | |
| 2004/0148561 | A1 | 7/2004 | Shen et al. | | |
| 2006/0047857 | A1 | 3/2006 | Dabiri et al. | | |
| 2009/0158127 | A1 | 6/2009 | Miyauchi et al. | | |
| 2010/0275096 | A1 | 10/2010 | Zhong et al. | | |
| 2011/0090734 | A1 | 4/2011 | Burger et al. | | |
| 2011/0320905 | A1* | 12/2011 | Lin | H04L 1/0067 | 714/752 |
| 2012/0141132 | A1 | 6/2012 | Walker | | |
| 2012/0240007 | A1 | 9/2012 | Barndt et al. | | |
| 2013/0139035 | A1 | 5/2013 | Zhong et al. | | |
| 2014/0310580 | A1 | 10/2014 | Zhang et al. | | |
| 2015/0046775 | A1 | 2/2015 | Prodan et al. | | |
| 2015/0263760 | A1* | 9/2015 | Hof | H03M 13/3707 | 714/758 |
| 2018/0109269 | A1 | 4/2018 | Richardson et al. | | |
| 2019/0042150 | A1 | 2/2019 | Wells et al. | | |
| 2019/0081639 | A1* | 3/2019 | Hanham | H03M 13/1108 | |
| 2019/0319741 | A1* | 10/2019 | Smith | H04L 1/0065 | |
| 2020/0083911 | A1 | 3/2020 | Heo et al. | | |
| 2020/0195354 | A1* | 6/2020 | Perin | H04L 27/227 | |
| 2021/0111833 | A1* | 4/2021 | Smith | H04B 10/532 | |
| 2024/0162920 | A1 | 5/2024 | Schedelbeck et al. | | |

OTHER PUBLICATIONS

G. -H. Gho, L. Klak, and J. M. Kahn, "Rate-adaptive coding for optical fiber transmission systems," J. Lightw. Technol., vol. 29, No. 2, pp. 222-233, Jan. 2011 (Year: 2011).

Final Office Action for U.S. Appl. No. 18/493,579, dated Jul. 18, 2024, 12 pages.

Non-Final Office Action for U.S. Appl. No. 18/493,579, dated May 6, 2024, 9 pages.

Office Action for Chinese Patent Application No. 2022800042064 mailed Jul. 4, 2026, 10 pages with translations.

* cited by examiner

PMD-TO-TC-MAC INTERFACE WITH 2-STAGE FEC PROTECTION

CROSS REFERENCE TO RELATED APPLICATIONS

This application is a continuation of U.S. patent application Ser. No. 18/493,579 filed on Oct. 24, 2023, which is a continuation of Ser. No. 17/810,830 filed on Jul. 5, 2022, which claims priority to U.S. Provisional Patent Application 63/218,396 filed on Jul. 4, 2021. The disclosure of these prior applications is considered part of the disclosure of this application and are hereby incorporated by reference in their entireties.

TECHNICAL FIELD

This disclosure relates to a system for a fiber optic data communication.

BACKGROUND

Passive optical networks (PONs) may include an optical line terminal (OLT) that may be connected to one or more optical network units (ONUs). Each of the optical line terminal (OLT) and the optical network units (ONUs) may include a transceiver configured with a physical media dependent (PMD) module and a transmission convergence-media access control (TC-MAC) module. The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

One aspect of the disclosure provides a system for a fiber-optic network. The system includes a transceiver. The transceiver includes a fiber-optic interface unit and a host unit. The host unit includes a low-complexity error correction decoder and a high-complexity error correction decoder. One or both from the low-complexity error correction decoder and the high-complexity error correction decoder are selected to decode input data from the fiber-optic interface unit. The input data includes codewords.

Implementations of the disclosure may include one or more of the following optional features. In some implementations, when the low-complexity error correction decoder and the high-complexity error correction decoder are selected to decode the input data from the fiber-optic interface unit, the low-complexity error correction decoder and the high-complexity error correction decoder are configured to decode the input data in a cascade order. In some implementations, the low-complexity error correction decoder decodes the input data prior to the high-complexity error correction decoder based on the cascade order. In some implementations, in response to an event that the low-complexity error correction decoder is unable to decode the input data, the high-complexity error correction decoder decodes the codewords. In some implementations, wherein in response to an event that the low-complexity error correction decoder and the high-complexity error decoder are unable to decode the codewords, the un-decodable input data is dropped from the network.

Optionally, the system includes a bit error rate (BER) estimator configured to estimate a bit error rate from the input data. In some implementations, one from the low-complexity error correction decoder and the high-complexity error correction decoder is selected based on the estimated BER. In some implementations, when the estimated BER is within in first BER range, the high-complexity error correction decoder decodes the input data. In some implementations, when the estimated BER is within a second BER range, the low-complexity error correction decoder decodes the input data. A first BER in the first range is greater than a second BER in the second range.

In some implementations, the system further includes an encoder in the fiber-optic interface unit. In some implementations, in response to an event that the fiber-optic interface unit includes the encoder, the low-complexity error correction decoder is selected to decode the input data.

Another aspect of the disclosure provides a system for a fiber-optic network. The system includes a transceiver. The transceiver includes a fiber-optic interface unit including a first forward error correction (FEC) decoder and a host unit including a second forward error correction (FEC) decoder. The host unit is configured to receive input data decoded by the first FEC decoder from the fiber-optic interface unit.

Implementations of the disclosure may include one or more of the following optional features. In some implementations, the first FEC decoder and the second FEC decoder are based on the same FEC code. In some implementations, the first FEC decoder and the second FEC decoder are configured to decode based on the same parity bits. In some implementations, the first FEC decoder is configured to decode the input data based on a first number of parity bits, and the second FEC decoder is configured to decode the decoded input based on a second number of parity bits that is less than the first number of parity bits. In some implementations, the fiber-optic interface unit and the host unit are configured such that the fiber optic interface is pluggable to the transceiver.

In some implementations, the first FEC decoder includes a soft-decision input low density parity check code (LDPC) decoder (soft-decision input Min-Sum LDPC decoder, a soft-decision input Belief-Propagation LDPC decoder). In some implementations, the second FEC decode is a hard-decision input low density parity check code (LDPC) decoder (e.g., hard-decision input Bit-Flip LDPC decoder, hard-decision input Min-Sum LDPC decoder.

DESCRIPTION OF DRAWINGS

Example implementations will be described and explained with additional specificity and detail through the use of the accompanying drawings in which.

Like reference symbols in the various drawings indicate like elements.

DETAILED DESCRIPTION

Figure 1:
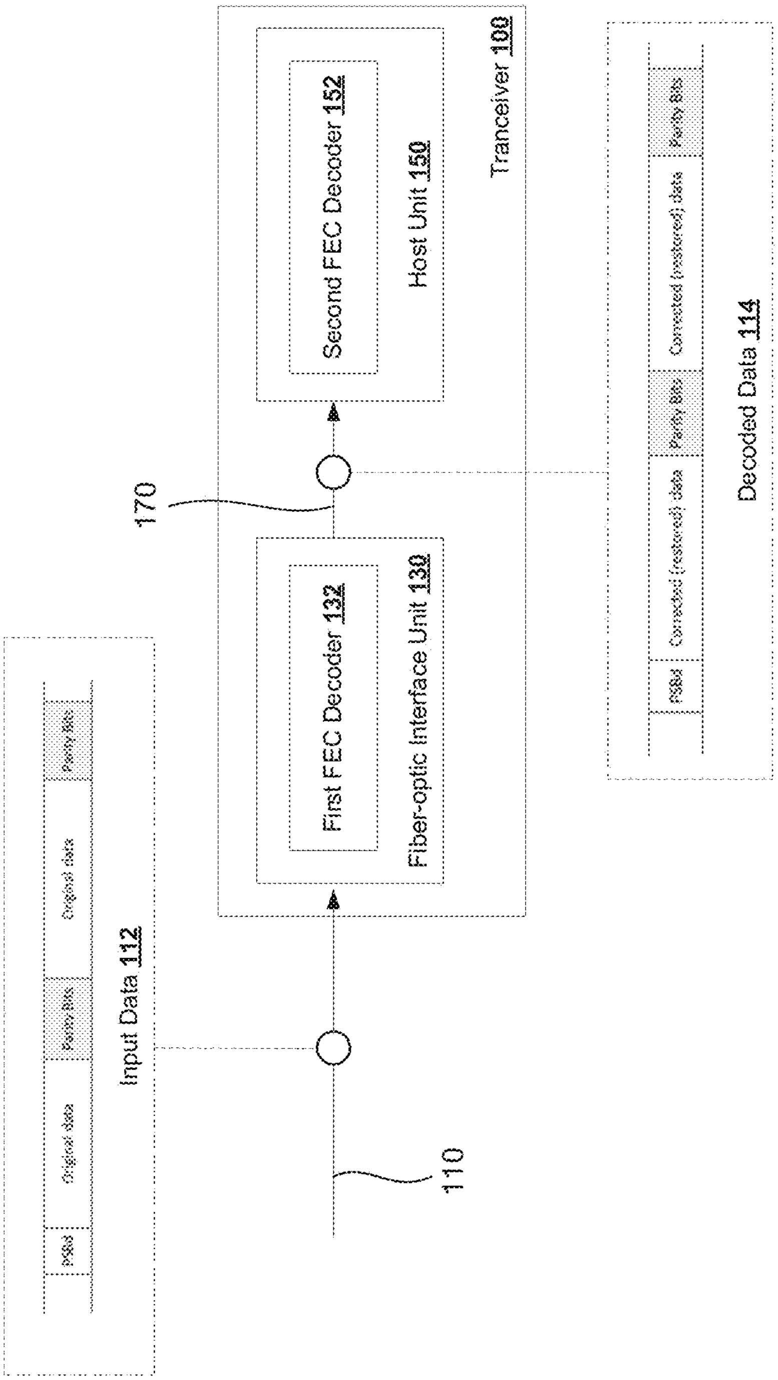
FIG. 1 is a simplified schematic view of an example transceiver associated with a fiber-optic interface unit, coupled with an optical fiber line, and a host unit.

Often systems need to transmit a sensitive message (e.g., data) where every symbol in the message is vital. One mistake can corrupt the entire message. No matter how systems communicate, they face this problem, since there is no perfect noiseless environment in term of data communication (e.g., digital data communication). One kind of corruption occurs when a bit flips—a transmitter sends a "1" but it is received as a "0" or a "0" which is received as a "1." These are called errors. Another kind of corruption is an erasure which occurs when the bits are so distorted that they are considered unknowns or blanks in the message. In this disclosure, for convenience purposes, the corruption is also referred to as an error.

In a system for a fiber-optic network, a transceiver in the fiber-optic network may suffer from the data corruption. Particularly, as the data transmission rate of the fiber-optic network increases, the data corruption is more likely to occur at the transceiver of the fiber-optic network. A transceiver may include a physical media dependent (PMD) module (hereinafter also referred as "fiber-optic interface unit") and a transmission convergence-media access control (TC-MAC) module (hereinafter also referred as "host unit"). The fiber-optic interface unit is configured to couple with one or more optical fiber lines. As a result, fast-traveling pulses of light are transmitted from the optical fiber line to the transceiver. At the fiber-optic interface unit, the fast-traveling pulses of light (e.g., input data including codewords) are received and converted into electrical signals (e.g., input data in electrical signal form) that can further travel to the host unit via an electrical interface (e.g., electrical interface on the fiber-optic interface unit side, electrical interface on the host unit side, electrical connection between the interfaces). Here, the data corruption can occur for various reasons (e.g., noise such as connection/line noise, intersymbol interference (ISI), fiber dispersion) when the pulses of light (input data) are traveled through the optical fiber line and received/converted into the electrical signal form and when input data in the electrical signal form is transmitted from the fiber-optic interface unit to the host unit via the electrical interface.

The present disclosure includes implementations of forward error correction (FEC) techniques that may increase the data transmission reliability of fiber-optic network by correcting the data corruption and decrease power consumption. In some circumstances, implementations of the present disclosure may include two-step FEC decoding (e.g., a first step FEC decoding at the fiber-optic interface unit and a second step FEC decoding at the host unit) that enables data corruption correction (e.g., error correction) in a seamless and efficient way.

The present disclosure may implement a fiber-optic interface unit integrated with a soft-decision input FEC decoder that leverages increased coding gain from soft-input (e.g., input data in analog electrical signal form). In some configurations, the FEC coding gain is not sacrificed by the impact of the electrical interface. Further, this configuration may enable additional coding gain from direct coupling to an advanced equalizer.

The present disclosure may enable a fiber-optic interface unit pluggable to a transceiver by making the electrical interface between the fiber-optic interface unit and a host unit more robust from the data corruption. When analog data (e.g., analog electrical signals) is exchanged between the fiber-optic interface unit and the host unit, the analog data is more likely to corrupt due to the noise. However, in some implementations, design of the printed circuit board for the transceiver is not limited by the high noise sensitivity of the electrical interface for analog data.

The present disclosure includes implementations of correcting bit errors mainly caused by an electrical interface in a seamless and efficient way on a host unit. In some implementations, the host unit may include a simplified FEC decoder that needs to correct data that has a comparatively low bit error rate (BER). In some implementations, an additional FEC encoding in a fiber-optic interface unit is not necessary since parity bits from a first FEC decoding step are re-used. In some implementations, additional timing markers are not necessary for delineation of FEC codewords since the framing structures and alignment markers from the received signal are reused. Accordingly, in some implementations, seamless integration into the processing chain is possible. In some implementations, real time exchange of meta data between the fiber-optic interface unit and the host unit is not necessary. In some implementations, additional standardization efforts are not necessary besides the BER of the electrical interface.

The present disclosure includes a simplified host unit with regard to sync pattern search and FEC decoding in accordance with some implementations. This also can be beneficial for multi-channel implementations of the host unit.

The present disclosure may provide line rates that are homogenous both on optical side (e.g., optical fiber line and fiber-optic interface unit) and electrical side (e.g., fiber-optic interface unit, host unit, and electrical connection between the fiber-optic interface unit and the host unit), and in both transmitting (TX) direction and receiving (RX) direction. Accordingly, a mixture of various line rates (on each section of the interfaces) is not necessary. For example, the same line rate is maintained from the optical fiber line to the host unit.

The present disclosure may provide a host unit, configured with two FEC decoders (e.g., two different types of decoder), which can work with the fiber-optic interface unit configured with and without FEC decoding capability. In some implementations, the host unit is configured to determine which type of decoder should be used (automatically) based on the BER of input data transmitted from the fiber-optic interface unit (e.g., codewords from the fiber-optic interface unit).

The present disclosure may be applied to any optical networking system, including high-speed PON (e.g., any speed above 10 Gbps, including 50G-PON an higher).

FIG. 1 is a simplified schematic view of an example transceiver 100 associated with a fiber-optic interface unit 130, coupled with an optical fiber line 110, and a host unit 150. As illustrated in FIG. 1, in some implementations, the fiber-optic interface unit 130 includes a first forward error correction (FEC) decoder 132 configured to decode input data 112 (e.g., codewords) transmitted from the optical fiber line 110. In some implementations, the fiber-optic interface unit 130 transmits the encoding result, decoded data 114. Likewise, in some implementations, the host unit 150 includes a second forward error correction (FEC) decoder 152 configured to additionally decode or correct the decoded data 114 (e.g., codewords) from the fiber-optic interface unit 130. As discussed above, the data corruption is likely to occur when the pulses of light (e.g., input data 112) is traveled through the optical fiber line 110 and received/converted into the electrical signal form and when the input data 112 in the electrical signal form is transmitted from the fiber-optic interface unit 130 to the host unit 150 via the electrical interface (e.g., electrical connection 170).

In some implementations, the first FEC decoder 132 is configured to correct errors caused by the "external interface" of the fiber-optic interface unit 130. In some circumstances, the noise (and other effects such as intersymbol interference, fiber dispersion) from the external interface (e.g., optical fiber line 110, optical fiber coupler at the fiber-optic interface unit 130) causes the input data 112 (e.g., codewords) to the transceiver 100 having a high bit error rate (BER). In some implementations, the first FEC decoder 132 is a soft-decision input low density parity check code (LDPC) decoder (e.g., soft-decision input Min-Sum LDPC decoder, soft-decision input Belief-Propagation LDPC decoder) that is suitable to correct the input data 112 with the high BER.

In some implementations, the second FEC decoder 152 is configured to correct errors caused by the "local interface" (e.g., electrical interface discussed above) between the fiber-optic interface unit 130 and the host unit 150. In some implementation, the noise (e.g., connection noise) from the local interface causes the decoded data 114 (e.g., codewords) to the host unit 150 having a low bit error rate (BER), which is lower than the BER of the input data 112. In some implementations, the second FEC decoder 132 is a hard-decision input low density parity check code (LDPC) decoder (e.g., hard-decision input Bit-Flip LDPC decoder, hard-decision input Min-Sum LDPC decoder) that is suitable to correct the decoded data 114 with the low BER.

In some implementations, the first FEC decoder 132 and the second decoder 152 are configured to operate based on the same FEC code. In some implementations, the FEC decoding at the first FEC decoder 132 and the second FEC decoder 152 is based on the same parity bits. In some implementations, the FEC decoding at the second FEC decoder 152 uses different parity bits. For example, the different parity bits includes a smaller number of parity bits than the parity bits used at the first FEC decoder 132. In some implementations, in the event that the smaller number of parity bits are used at the second FEC decoder 152, the rest of the bit positions are filled with auxiliary information (e.g., control information, management information). In some implementations, the rest of the bit positions are simply padded. In some implementations, the fiber-optic interface unit 130 and the host unit 150 are configured such that the fiber optic interface unit 130 is pluggable to the transceiver 100.

Figure 2:
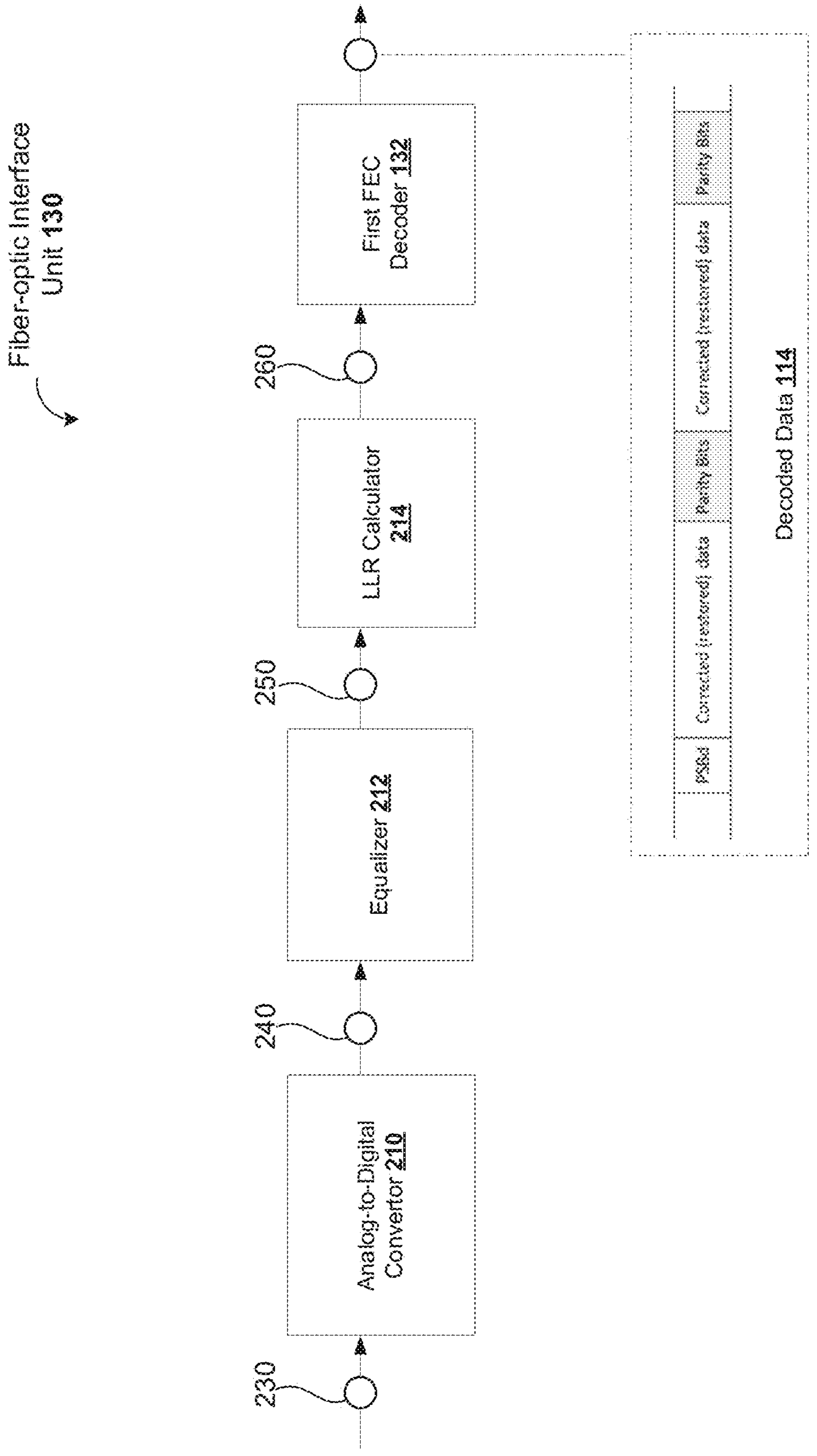
FIG. 2 is a simplified schematic view of an example fiber-optic interface unit associated with a first FEC decoder.

FIG. 2 is a simplified schematic view of an example fiber-optic interface unit 130 associated with the first FEC decoder 132. In some implementations, the fiber-optic interface unit 130 includes an analog-to-digital convertor (ADC) 210, digital equalizer 212, log likelihood ratio (LLR) calculator 214, and the first FEC decoder 132. As illustrated in FIG. 2, in some implementations, analog input signal 230 (i.e., input data 112 in an electrical signal form) is converted to digital samples 240 at the ADC 210, and the digital equalizer 212 processes the digital samples 240 from the ADC 210. In this configuration, the LLR calculator 230 converts the output 250 from the digital equalizer 212 to LLR values 260, and the LLR values 260 are used by the first FEC decoder 132 (soft-decision input FEC decoder in this example) for FEC decoding to generate the decoded data 114 (corrected bits of FEC codewords including data and parity bits). In some implementations, the digital equalizer 212 includes a feed-forward equalizer (FFE). In some implementations, the digital equalizer 212 includes a decision forward equalizer (DFE). In some implementations, the digital equalizer 212 include a combination of the feed forward equalizer (FFE) and the decision forward equalizer (DFE). However, this disclosure does not limit the digital equalizer 212 to the feed forward equalizer (FFE) and the decision feedback equalizer (DFE). For example, the digital equalizer 212 may include any suitable equalizer such as Bahl-Cocke-Jelinek-Raviv (BCJR) equalizer. In some implementations, the first FEC decoder 132 is a soft-decision input FEC decoder (e.g., soft-decision input Min-Sum LDPC FEC decoder, soft-decision input Belief-Propagation LDPC FEC decoder).

In some implementations, the decoded data 114 including corrected bits of FEC codewords (while maintaining the parity bits and framing structure and alignment markers such as PSBd) from the first FEC decoder 132 is forwarded to the host unit 150 via the electrical interface for an additional decoding at the second FEC decoder 152. Hence, the line data rate can be maintained the same from the optical fiber line 110 to the electrical interface and the electrical interface (e.g., electrical connection 170) to the host unit 150.

In some implementations, the decoded data 114 is screamed before transmitting to the host unit 150 over the electrical connection 170, and the screamed decoded data 114 is de-screamed (prior to the second FEC decoder 152) at the host unit 150.

In some implementations, the decoded data 114 is transmitted via the electrical connection 170 using a suitable modulation (e.g., non-return to zero (NRZ) modulation, 4-level pulse-amplitude (PAM4) modulation).

In some implementations, framing structure and alignment markers included in the input data 112 are re-used or maintained in the decoded data 114. For example, frame synchronization information (e.g., downstream physical synchronization block PSBd) included in the input data 112 is not deleted at the fiber-optic interface unit 130 and still be included in the decoded data 114 to the host unit 150.

Referring back to FIG. 1, in some implementations, the decoded data 114 in FIG. 2 is forwarded to the second FEC decoder 152 of the host unit 150 via the electrical interface (e.g., electrical connection 170). As discussed above, when the data is transmitted from the fiber-optic interface unit 130 to the host unit 150 via the electrical interface, the errors (e.g., bit errors) could occur to the data due to the noise (e.g., connection noise). In some implementations, the second FEC decoder 152 is configured to correct the bit errors caused by the electrical interface. The decoded data 114 to the second FEC decoder 152 includes decided bits from the first FEC decoder 132, and some moderate amount of the bit errors (caused by the electrical interface). In some implementations, a simpler decoding algorithm for the second FEC decoder 152 is used to correct with the bit errors. For example, the second FEC decoder 152 is a hard-decision input FEC decoder (e.g., hard-decision input Bit-Flip LDPC decoder, hard-decision input Min-Sum LDPC decoder).

As discussed above, in some implementations, the second FEC decoder 152 associated with the host unit 150 is less capable of correcting the errors. However, the present disclosure does not limit the decoding capability of the second FEC decoder 152. In some implementations, the second FEC decoder 152 can be a FEC decoder equipped with a sophisticated FEC algorithm (e.g., high-complexity FEC decoder) to response to different variants of the fiber-optic interface unit 130. For example, some variants of the fiber-optic interface unit 130 do not include the first FEC decoder 132, and some other variants of the fiber-optic interface unit 130 include the first FEC decoder 132 (e.g., FEC decoder with a low decoding capability) that is not suitable to decode the input data 112 with a high BER.

Figure 3:
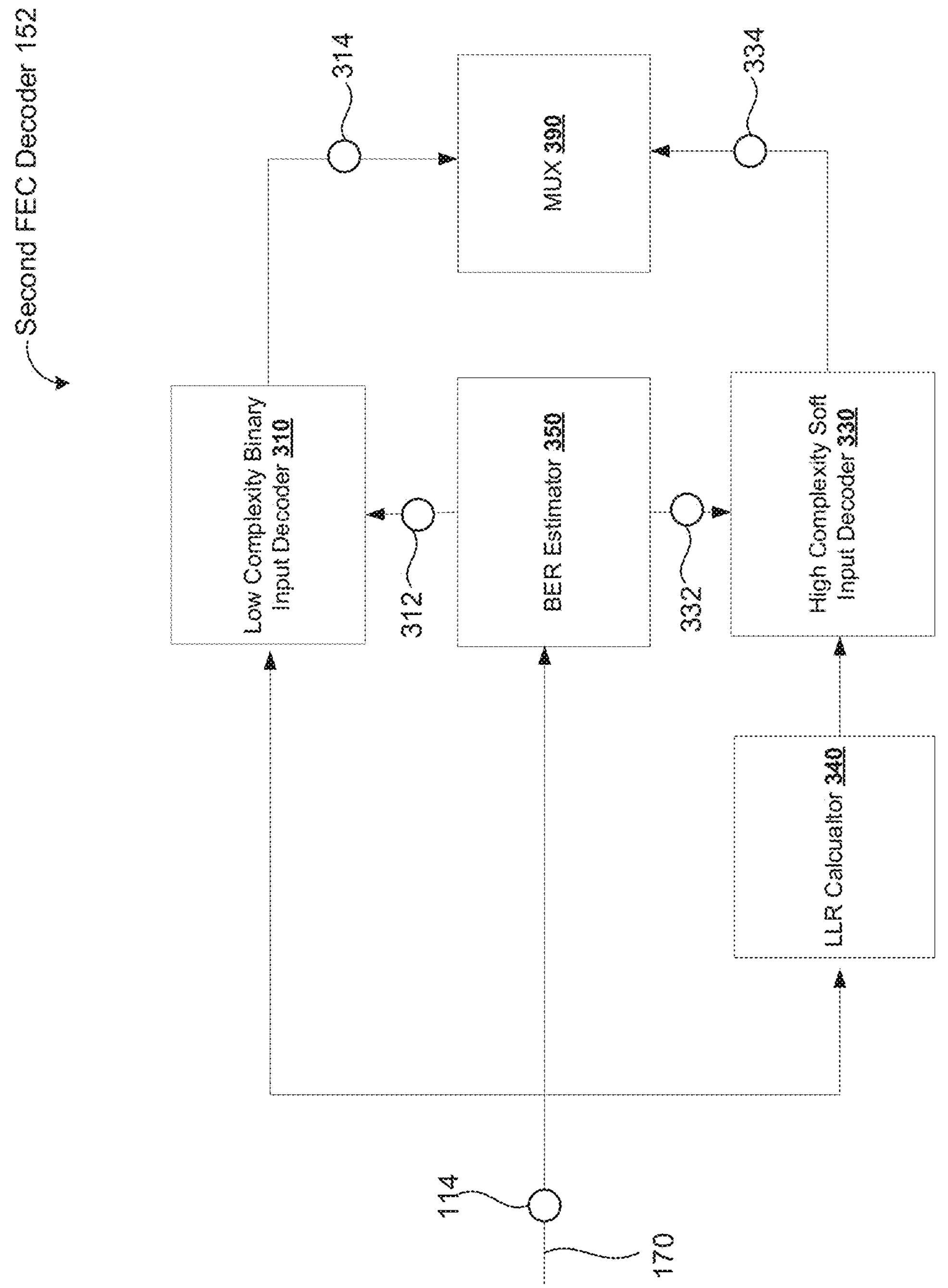
FIG. 3 is a simplified schematic view of an example host unit associated with a second FEC decoder.
Figure 4:
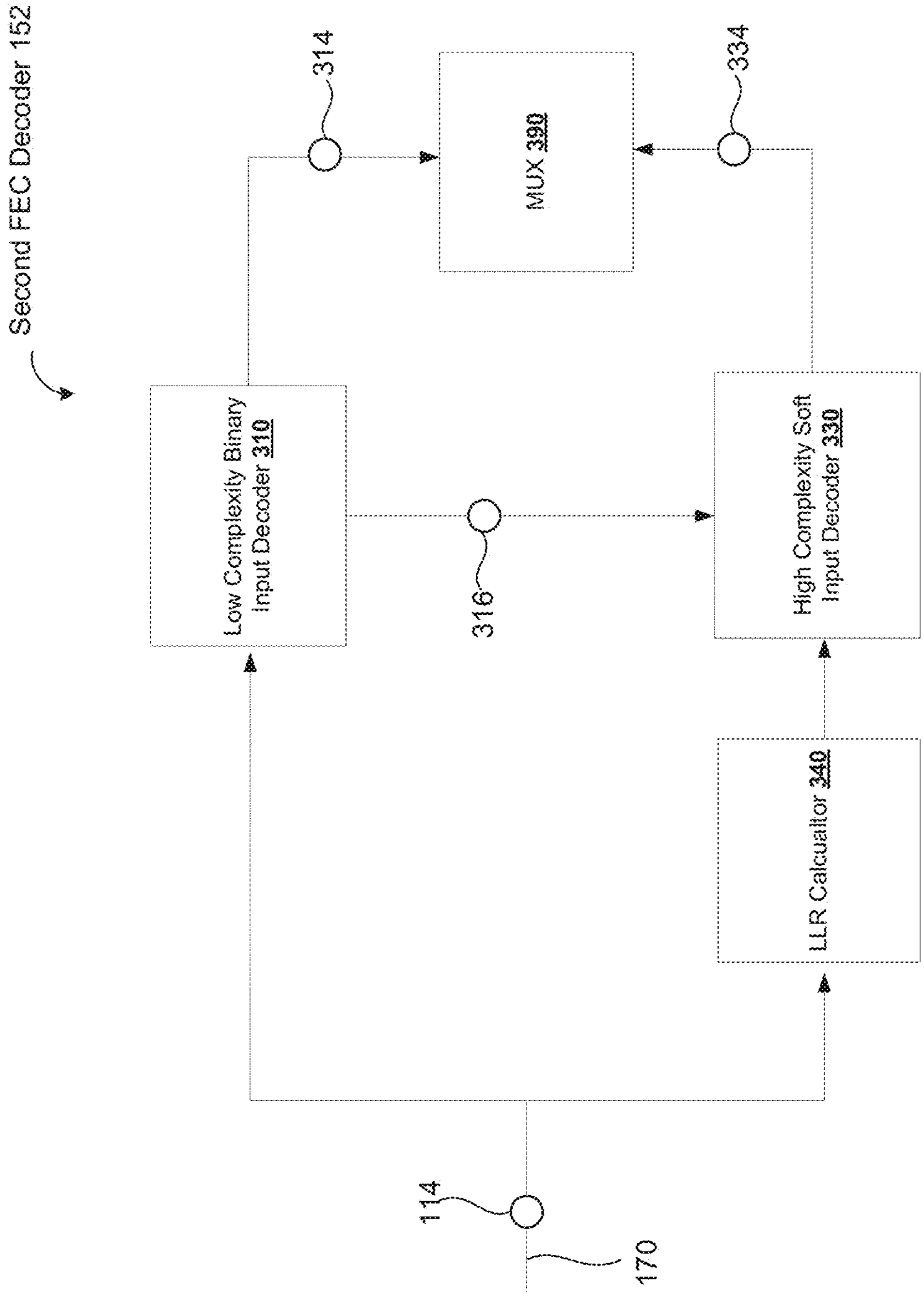
FIG. 4 is a simplified schematic view of another example host unit associated with a second FEC decoder.

Referring to FIGS. 3-4, in some implementation, the second FEC decoder 132 includes more than one FEC decoder in various configurations to response to the different variants of the fiber-optic interface unit 130 discussed above.

FIG. 3 is a simplified schematic view of an example host unit 150 associated with the second FEC decoder 152. As illustrated in FIG. 3, in some implementations, the second FEC decoder 152 include a low-complexity LDPC FEC decoder 310 (FEC decoder with a less sophisticated FEC algorithm which generally consumes less power), configured to handle the decoded data 114 with a low BER, and a high-complexity LDPC FEC decoder 330 (FEC decoder with a sophisticated FEC algorithm which generally consumes substantial power), configured to handle the decoded data 114 with a high BER. In some implementations, the low-complexity LDPC FEC decoder 310 includes a Bit Flipping binary input decoder. In some implementations, the high-complexity LDPC FEC decoder 330 includes a Min-Sum soft input decoder or a Sum-Product soft input decoder.

As illustrated in FIG. 3, in some implementations, the second FEC decoder 152 includes a decoder selector 350 configured to estimate BER of the decoded data 114 (e.g., binary input samples) and to determine which decoder to enable to decode the decoded data 114 based on the estimated BER. For example, when the estimated BER of the decoded data 114 is determined to be high, the decoder selector 350 selects or enables the high-complexity LDPC FEC decoder 330. Likewise, when the estimated BER of the decoded data 114 is determined to be low, the decoder selector 350 selects or enables the low-complexity LDPC FEC decoder 310. In some implementations, the selector 350 determines or estimates the BER of the decoded data 114 based on syndrome weight of the decoded data 114 (e.g., greater the syndrome weight of the input signals, greater the BER of the input signals).

As illustrated in FIG. 3, in some implementations, the decoded data 114 from the fiber-optic interface unit 130 is transmitted to the selector 350, the low-complexity LDPC FEC decoder 310, and the high-complexity LDPC FEC decoder 330. As shown, in some implementations, the decoded data 114 is transmitted to the high-complexity LDPC FEC decoder 310 via a LLR calculator 340. As discussed above, the decoder selector 350 determines or estimates the BER of the decoded data 114 and selects one of the low-complexity LDPC FEC decoder 310 and the high-complexity LDPC FEC decoder 330 based on the estimated BER. In an event that the decoder selector 350 determines that estimated BER of the decoded data 114 is high, the decoder selector 350 enables or selects the high-complexity LDPC FEC decoder 330 (e.g., transmitting an enable signal 332). Likewise, in an event that the decoder selector 350 determines that estimated BER of the input data is low, the decoder selector 350 enables or selects the low-complexity LDPC FEC decoder 310 (e.g., transmitting an enable signal 312). By utilizing the low-complexity LDPC FEC decoder 310 when the high-complexity LDPC FEC decoder 330 is not necessary, a substantial power conservation can be achieved. Accordingly, less heat is created at the host unit 150. As shown in FIG. 3, when the low-complexity LDPC FEC decoder 310 receives an enable signal 312 from the decoder selector 350, the decoded data 114 is decoded by the low complexity LDPC FEC decoder 310. As a result, the low-complexity LDPC FEC decoder 310 transmits the decoded or corrected decoded data 314 (e.g., corrected bits) to a multiplexer (MUX) 390. Likewise, when the high-complexity LDPC FEC decoder 330 receives an enable signal 332 from the decoder selector 350, the decoded data 114 is decoded by the high-complexity LDPC FEC decoder 330. As a result, the high-complexity LDPC FEC decoder 330 transmits the decoded or corrected decoded data 334 to the multiplexer (MUX) 390.

FIG. 4 is a simplified schematic view of another example host unit 150 associated with the second FEC decoder 152. As illustrated in FIG. 4, in some implementations, the second FEC decoder 152 includes a low-complexity LDPC FEC decoder 310 and a high-complexity LDPC FEC decoder 330. In some implementations, unlike the dual decoder configuration shown in FIG. 3, the low-complexity LDPC FEC decoder 330 is configured to enable the high-complexity LDPC FEC decoder 330 in an event that the low-complexity LDPC FEC decoder 330 is unable to decode the decoded data 114 from the fiber-optic interface unit 130.

In some implementations, the low-complexity LDPC FEC decoder 310 includes a FEC decoder with a less sophisticated FEC algorithm, which generally consumes less power (e.g., Bit Flipping binary input decoder). In some implementations, the high-complexity LDPC FEC decoder 330 includes a FEC decoder with a sophisticated FEC algorithm, which generally consumes substantial power (e.g., Min-Sum soft input decoder, Sum-Product soft input decoder).

As illustrated in FIG. 4, in some implementations, the decoded data 114 (e.g., binary input samples) from the fiber-optic interface unit 130 is transmitted to the low-complexity LDPC FEC decoder 310 and the high-complexity LDPC FEC decoder 330. As shown, in some implementations, the decoded data 114 is transmitted to the high-complexity LDPC FEC decoder 310 via a LLR calculator 340. As discussed above, the low-complexity LDPC FEC decoder 310 is configured to decode the decoded data 114 and further configured to transmit the decoded or corrected decoded data 314 to the multiplexer (MUX) 390. In the event that the low-complexity LDPC FEC decoder 310 is unable to decode the decoded data 114, the low-complexity LDPC FEC decoder 310 is configured to enable the high-complexity LDPC FEC decoder 330 so that the remaining decoded data 114, which is not able to decode by the low-complexity LDPC FEC decoder 310, can be decoded by the high-complexity LDPC FEC decoder 330. As shown in FIG. 4, in some implementations, the low-complexity LDPC FEC decoder 310 enables the high-complexity LDPC FEC decoder 330 by transmitting an enable signal 316 to the high-complexity LDPC FEC decoder 330. Based on the enable signal 316 from the low-complexity LDPC FEC decoder 310, the high-complexity LDPC FEC decoder 330 decodes the decoded data 114 that the low-complexity LDPC FEC decoder 310 fails to decode or correct and transmits the decoded or corrected decoded data 334 to the multiplexer (MUX) 390. By utilizing the high-complexity LDPC FEC decoder 330 only when it is necessary based on a cascade order (e.g., first in the cascade order, low-complexity LDPC FEC decoder 330, second in the cascade order, high-complexity LDPC FEC decoder 330), a substantial power conservation can be achieved. Accordingly, less heat is created at the host unit 150.

In some implementations, to make the first FEC decoder 132 more energy efficient, the target output (i.e., decoded data 114) of BER of the first FEC decoder 132 is adjusted so that the decoded data 114 has a BER that is close to a predetermined BER (e.g., the maximum BER that the second FEC decoder 152 can tolerate and still be able to produce an output with the system target BER such as BER 1e-12). For example, the target BER of the output of the first FEC decoder 132 is increased to the BER over the electrical interface, instead of the system BER of 1e-12. This method prevents the first FEC decoder 132 from overworking and provides an adequate amount of work (e.g., decoding) to the second FEC decoder 152 which is configured to operate regardless of the amount of work.

Figure 5:
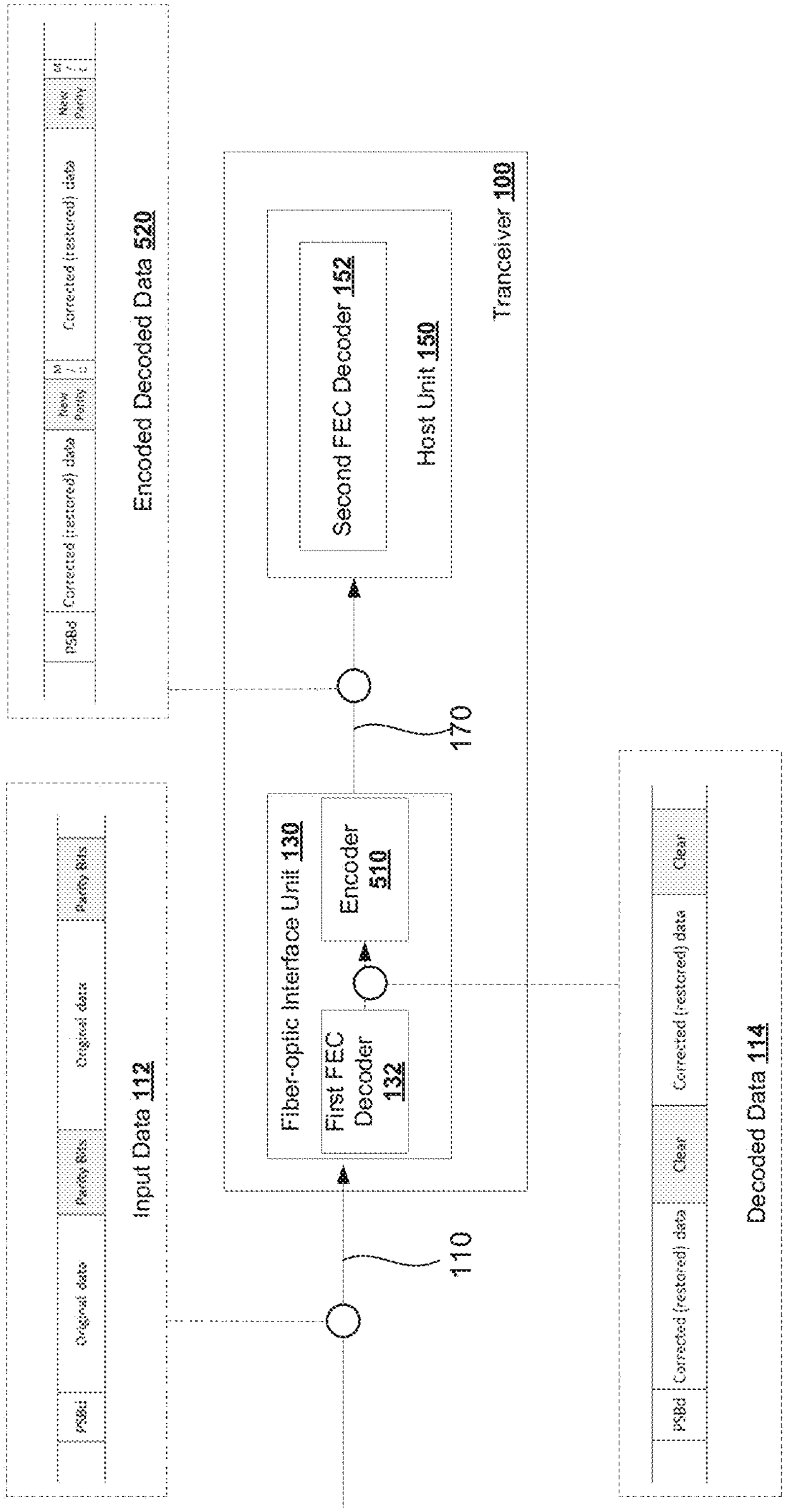
FIG. 5 is a simplified schematic view of another example fiber-optic interface unit associated with a first FEC decoder.

FIG. 5 is a simplified schematic view of another example fiber-optic interface unit 130 associated with the first FEC decoder 132. In some implementations, as illustrated in FIG. 5, the input data 112 decoded by the first FEC decoder 132, together with the frame synchronization information (e.g., PSBd) are used to produce encoded decoded data 520 including a new set of parity bits using additional systematic encoder 510 (e.g., Reed-Solomon encoder). As shown in FIG. 5, in some implementations, new parity bits (New Parity in FIG. 5) are inserted instead of the parity bits transmitted over the optical fiber line 110. Since the number of these new parity bits is smaller than the original number of parity bits used in optical fiber line 110 (due to relatively low BER in the electrical interface), in some implementations, the rest of parity bit positions is filled up with control, management, timing synchronization, or other auxiliary information (M/C in FIG. 5) (related with fiber-optic interface unit 130) to assist synchronization with the host unit 150. In some implementations, the unused parity bit positions are padded appropriately. This is needed to get the same line rate over electrical interface and over the electrical line in the receive direction, which also equals to the line rate in the transmit direction. To decode the data encoded by the additional systematic encoder 510, the second FEC decoder 152 is configured to process the data encoded by the additional encoder 510.

In some circumstances, due to the encoder 510 in the fiber-optic interface 130, a less sophisticated second FEC decoder 152 (e.g. lower complexity FEC decoder than the first FEC decoder 132) can be used (because of the encoded decoded data 520 has a low BER. Also there is no need for re-synchronization and recovery the synchronization data at the host unit 150 since these are done once at the fiber-optic interface unit 130.

Figure 6:
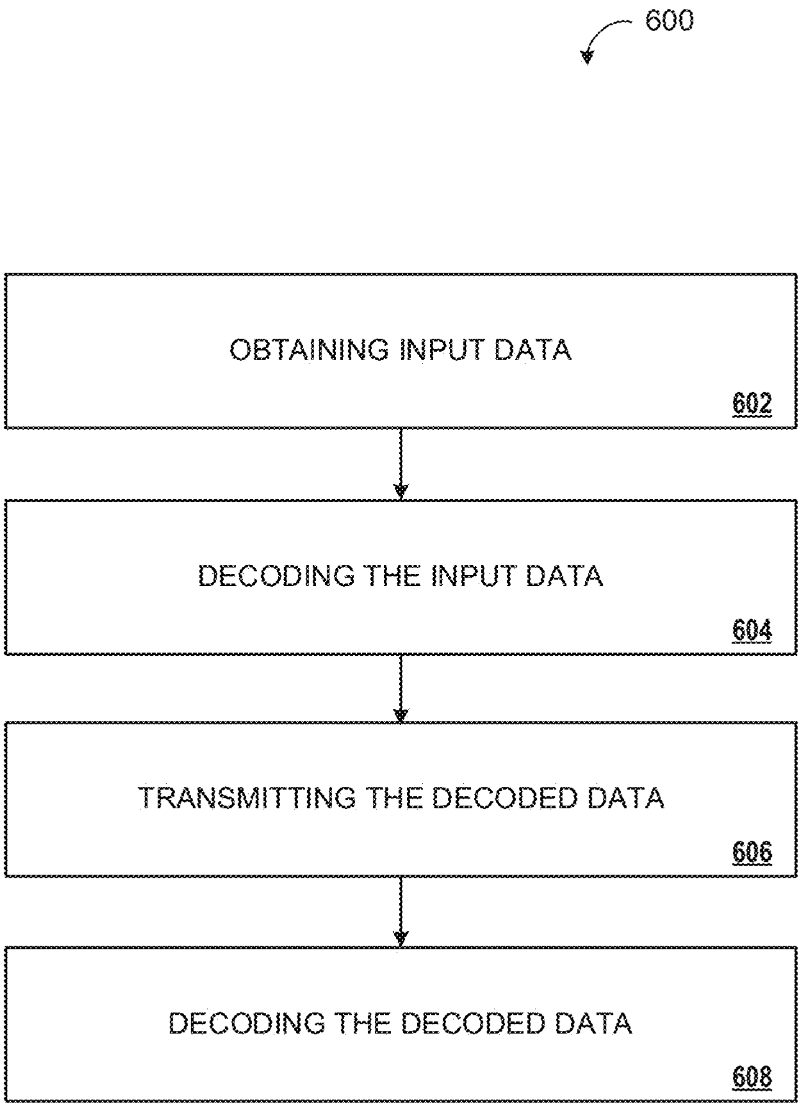
FIG. 6 is a flowchart of an example arrangement of operations for a method of decoding input data from an optical fiber line.

FIG. 6 is a flowchart of an example arrangement of operations for a method 600 of decoding input data 112 from an optical fiber line 110. The method 600 may be performed by processing logic that may include hardware (circuitry, dedicated logic, etc.), software (such as is run on a general purpose computer system or a dedicated machine), or a combination of both, which processing logic may be included in any computer system or device. For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method, at operation 602, includes, obtaining or receiving the input data 112 from the optical fiber line 110. As discussed above, the input data 112 is in a form of fast-traveling pulses of light. After receiving the input data 112, a fiber-optic interface unit 130 convert the input data 112 to an electrical signal form and the input data 112 (in the electrical signal form) is forwarded to a first FEC decoder 132.

At operation 604, the method 600 includes, decoding the input data 112. As discussed, the input data 112 is decoded by the first FEC decoder 132 associated with the fiber-optic interface unit 130. In some implementations, the first FEC decoder 132 is a soft-decision input low density parity check code (LDPC) decoder (e.g., soft-decision input Min-Sum LDPC decoder, soft-decision input Belief-Propagation LDPC decoder) that is suitable to correct the input data 112 with the high BER. After the decoding, decoded data 114, which is a result of decoding the input data 112, is transmitted to a host unit 150.

At operation 606, the method 600 includes, transmitting the decoded data 114 to the host unit 150 via an electrical connection 170. As discussed, the decoded data 114 is transmitted via the electrical connection 170 using a suitable modulation (e.g., non-return to zero (NRZ) modulation, 4-level pulse-amplitude (PAM4) modulation).

At operation 608, the method 600 includes, decoding the decoded data 114. As discussed, the decoded data 114 is decoded by a second FEC decoder 152 associated with the host unit 150. In some implementations, the second FEC decoder 132 is a hard-decision input low density parity check code (LDPC) decoder (e.g., hard-decision input Bit-Flip LDPC decoder, hard-decision input Min-Sum LDPC decoder) that is suitable to correct the decoded data 114 with the low BER.

Figure 7:
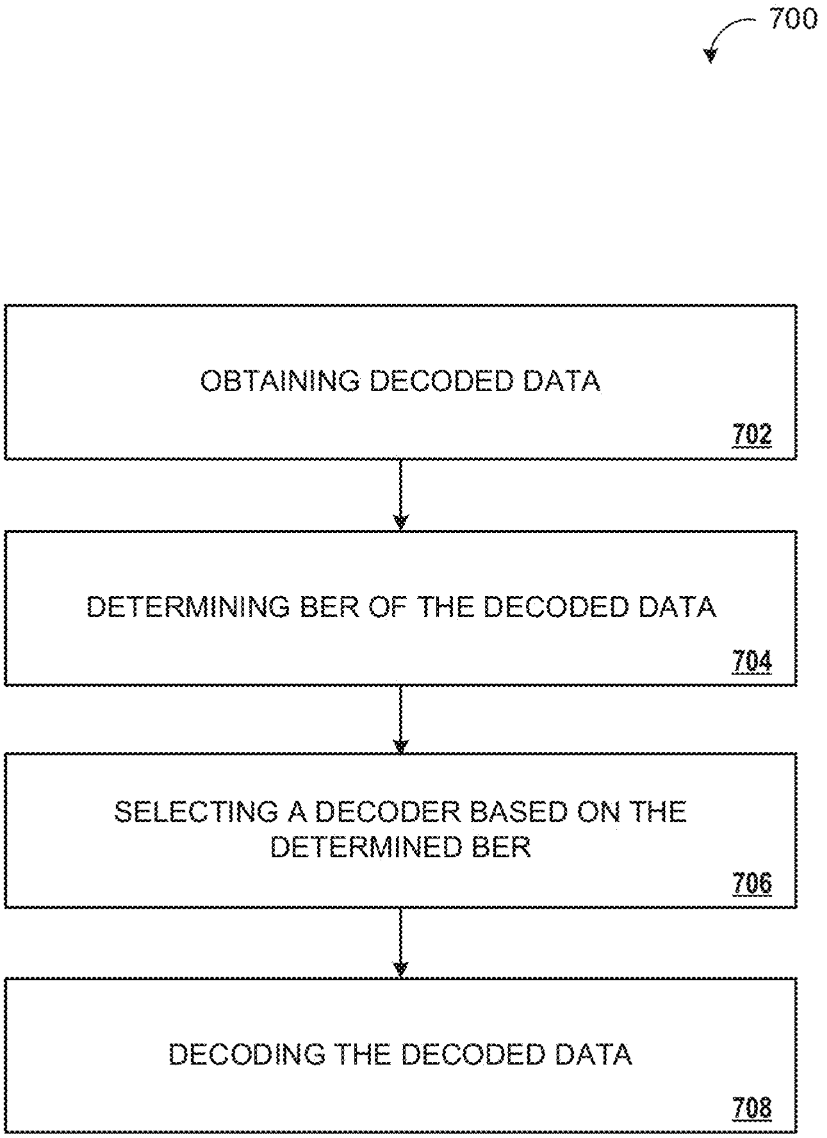
FIG. 7 a flowchart of an example arrangement of operations for a method of decoding decoded data from a fiber-optic interface unit using two decoders.

FIG. 7 is a flowchart of an example arrangement of operations for a method 700 of decoding decoded data 114 from a fiber-optic interface unit 130 using two decoders. The method 700 may be performed by processing logic that may include hardware (circuitry, dedicated logic, etc.), software (such as is run on a general purpose computer system or a dedicated machine), or a combination of both, which processing logic may be included in any computer system or device. For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method, at operation 702, includes, obtaining or receiving the decoded data 114 from the fiber-optic interface unit 130. As discussed above, the decoded data 114, from the fiber-optic interface unit 130, is received by a second FEC decoder 152. In some implementations, the second FEC decoder 152 include a low-complexity LDPC FEC decoder 310 (FEC decoder with a less sophisticated FEC algorithm which generally consumes less power), configured to handle the decoded data 114 with a low BER, and a high-complexity LDPC FEC decoder 330 (FEC decoder with a sophisticated FEC algorithm which generally consumes substantial power), configured to handle the decoded data 114 with a high BER. In some implementations, the low-complexity LDPC FEC decoder 310 includes a Bit Flipping binary input decoder. In some implementations, the high-complexity LDPC FEC decoder 330 includes a Min-Sum soft input decoder or a Sum-Product soft input decoder.

The method, at operation 704, includes, determining or estimating a BER of the decoded data 114. As discussed, in some implementations, the second FEC decoder 152 includes a decoder selector 350 configured to estimate BER of the decoded data 114 (e.g., binary input samples) and to determine which decoder to enable to decode the decoded data 114 based on the estimated BER. For example, when the estimated BER of the decoded data 114 is determined to be high, the decoder selector 350 selects or enables the high-complexity LDPC FEC decoder 330. Likewise, when the estimated BER of the decoded data 114 is determined to be low, the decoder selector 350 selects or enables the low-complexity LDPC FEC decoder 310. In some implementations, the selector 350 determines or estimates the BER of the decoded data 114 based on syndrome weight of the decoded data 114 (e.g., greater the syndrome weight of the input signals, greater the BER of the input signals).

The method, at operation 706, includes, selecting a decoder to decode the decoded data 114. As discussed above, the decoder selector 350 determines or estimates the BER of the decoded data 114 and select one of the low-complexity LDPC FEC decoder 310 and the high-complexity LDPC FEC decoder 330 based on the estimated BER. In an event that the decoder selector 350 determines that estimated BER of the decoded data 114 is high (e.g., 1e-4 or greater), the decoder selector 350 enables or selects the high-complexity LDPC FEC decoder 330 (e.g., transmitting an enable signal 332). Likewise, in an event that the decoder selector 350 determines that estimated BER of the input data is low (e.g., less than 1e-4), the decoder selector 350 enables or selects the low-complexity LDPC FEC decoder 310 (e.g., transmitting an enable signal 312).

The method, at operation 708, includes, decoding the decoded data 114. As discussed, when the low-complexity LDPC FEC decoder 310 receives an enable signal 312 from the decoder selector 350, the decoded data 114 is decoded by the low complexity LDPC FEC decoder 310. As a result, the low-complexity LDPC FEC decoder 310 transmits the decoded or corrected decoded data 314 (e.g., corrected bits) to a multiplexer (MUX) 390. Likewise, when the high-complexity LDPC FEC decoder 330 receives an enable signal 332 from the decoder selector 350, the decoded data 114 is decoded by the high-complexity LDPC FEC decoder 330. As a result, the high-complexity LDPC FEC decoder 330 transmits the decoded or corrected decoded data 334 to the multiplexer (MUX) 390.

Figure 8:
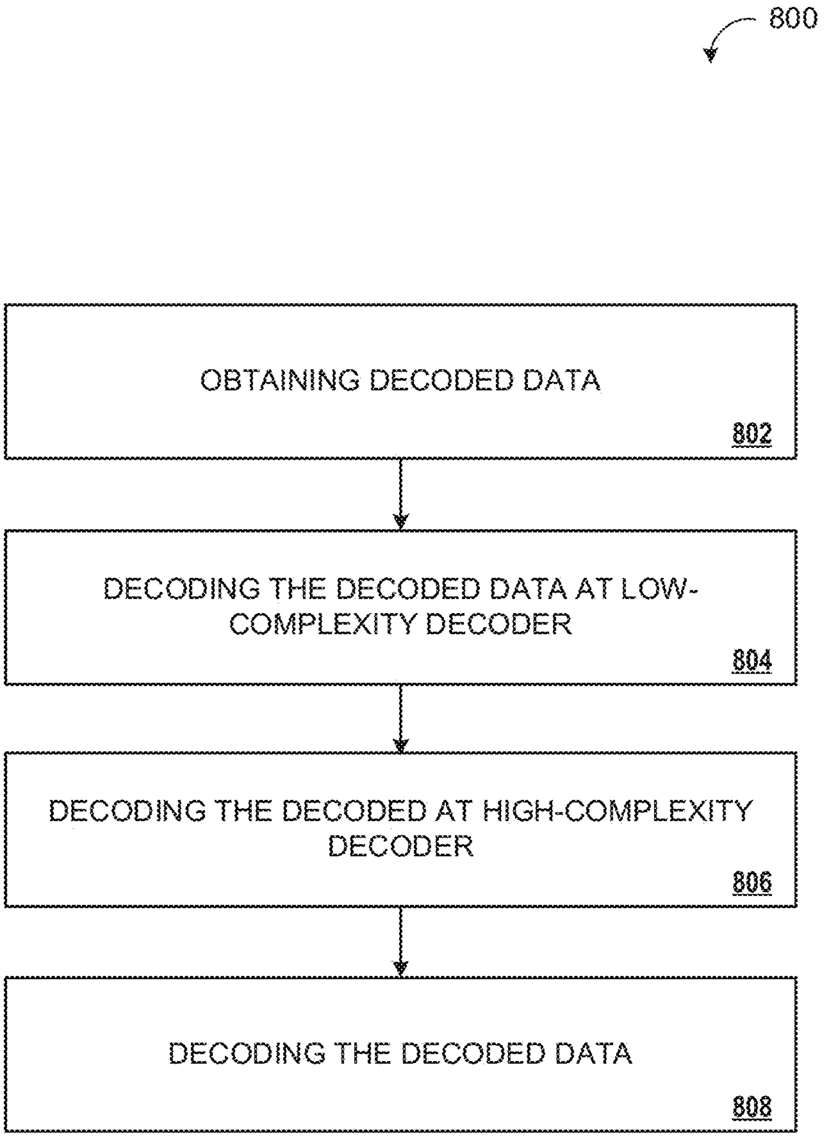
FIG. 8 a flowchart of an example arrangement of operations for another method of decoding decoded data from a fiber-optic interface unit using two decoder.

FIG. 8 is a flowchart of an example arrangement of operations for another method 800 of decoding decoded data 114 from a fiber-optic interface unit 130 using two decoder. The method 800 may be performed by processing logic that may include hardware (circuitry, dedicated logic, etc.), software (such as is run on a general purpose computer system or a dedicated machine), or a combination of both, which processing logic may be included in any computer system or device. For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method, at operation 802, includes, obtaining or receiving the decoded data 114 from the fiber-optic interface unit 130. As discussed above, the decoded data 114, from the fiber-optic interface unit 130, is received by the second FEC decoder 152. In some implementations, the second FEC decoder 152 includes a low-complexity LDPC FEC decoder 310 and a high-complexity LDPC FEC decoder 330. In some implementations, the low-complexity LDPC FEC decoder 330 is configured to enable the high-complexity LDPC FEC decoder 330 in an event that the low-complexity LDPC FEC decoder 330 is unable to decode the decoded data 114 from the fiber-optic interface unit 130.

The method, at operation 804, includes, decoding the decoded data 114 at the low-complexity LDPC FEC decoder 310. As discussed above, the low-complexity LDPC FEC decoder 310 is configured to decode the decoded data 114 and further configured to transmit the decoded or corrected decoded data 314 to the multiplexer (MUX) 390.

The method, at operation 806, includes, decoding the decoded data 114 at the high-complexity LDPC FEC decoder 330. As discussed, in the event that the low-complexity LDPC FEC decoder 310 is unable to decode the decoded data 114, the low-complexity LDPC FEC decoder 310 is configured to enable the high-complexity LDPC FEC decoder 330 so that the remaining decoded data 114, which were not able to decode by the low-complexity LDPC FEC decoder 310, can be decoded by the high-complexity LDPC FEC decoder 330. In some implementations, the low-complexity LDPC FEC decoder 310 enables the high-complexity LDPC FEC decoder 330 by transmitting an enable signal 316 to the high-complexity LDPC FEC decoder 330. Based on the enable signal 316 from the low-complexity LDPC FEC decoder 310, the high-complexity LDPC FEC decoder 330 decodes the decoded data 114 that the low-complexity LDPC FEC decoder 310 fails to decode or correct and transmits the decoded or corrected decoded data 334 to the multiplexer (MUX) 390.

Figure 9:
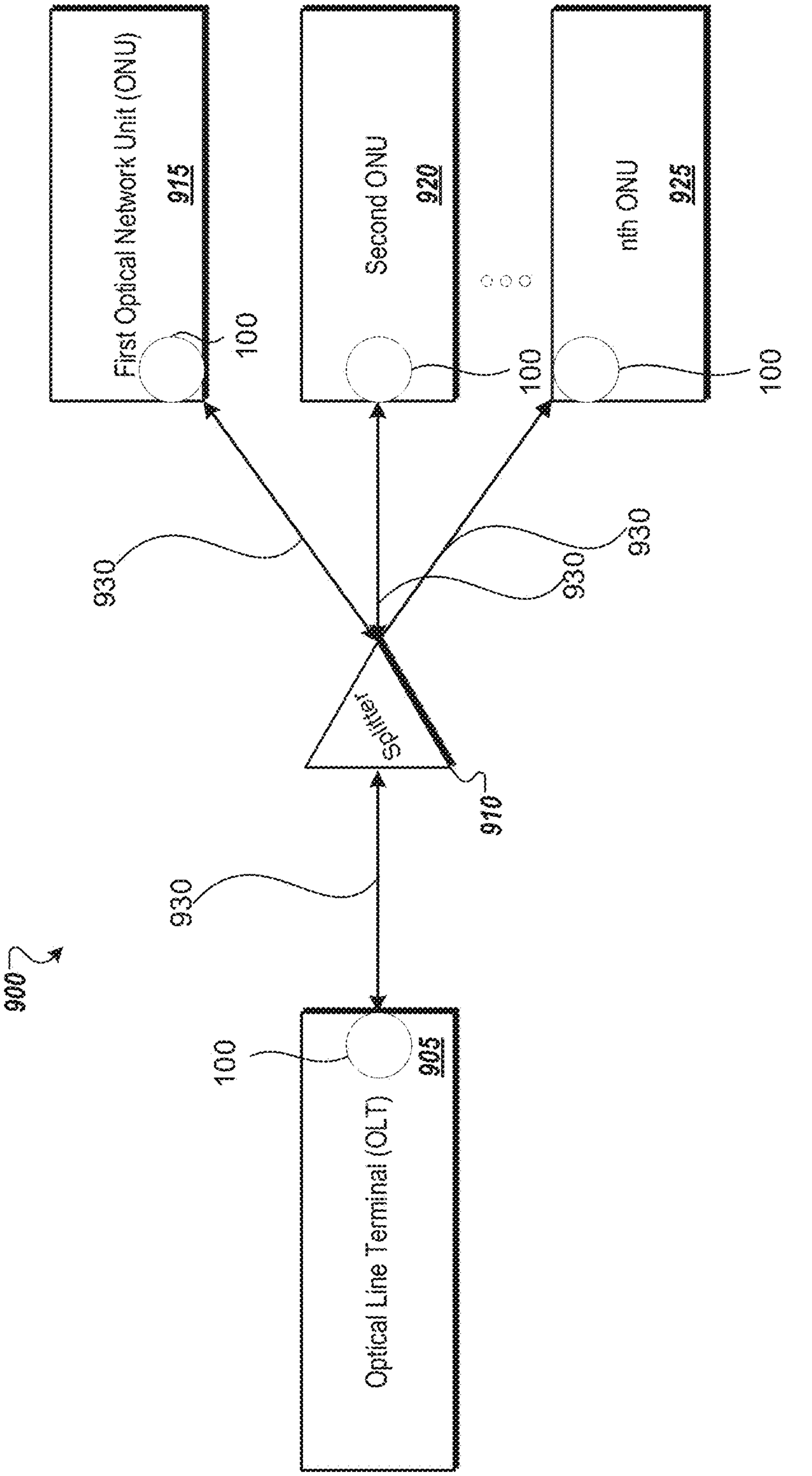
FIG. 9 is a simplified schematic view of an example passive optical network (PON) implemented with one or more transceivers.

FIG. 9 is a simplified schematic view of an example passive optical network (PON) 900 implemented with one or more transceivers 100. As shown in FIG. 9, in some implementations, the PON 900 includes an optical line terminal (OLT) 905, a splitter 910, a first optical network unit (ONU) 915, a second ONU 920, and an nth ONU 925. As shown, each of the ONUs 915, 920, 925 is connected the splitter 910 using an optical fiber line 930, and the OLT 905 is connected to the splitter 910 using the optical fiber line 930. As result, each of the 915, 920, 925 is connected the OLT 905.

In some implementations, at least one of the ONUs 915, 920, 925 includes the transceiver 100. In some implementations, the optical line terminal (OLT) 905 includes the transceiver 100. As shown, in some implements, each of ONUs 915, 920, 925 and OLT 905 includes the transceiver 100.

A number of implementations have been described. Nevertheless, it will be understood that various modifications may be made without departing from the spirit and scope of the disclosure. Accordingly, other implementations are within the scope of the following claims.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A system for a fiber-optic network, comprising:

a transceiver including:

a fiber-optic interface unit including a first forward error correction (FEC) decoder; and a host unit including a second forward error correction (FEC) decoder, wherein the host unit is configured to receive input data decoded by the first FEC decoder from the fiber-optic interface unit, wherein the fiber-optic interface unit includes a Physical Media Dependent (PMD) device, wherein the host unit includes a TC/MAC device.

2. The system of claim 1, wherein the first FEC decoder and the second FEC decoder are based on the same FEC code.

3. The system of claim 2, wherein the first FEC decoder and the second FEC decoder are configured to decode based on the same parity bits.

4. The system of claim 1, wherein:

the first FEC decoder is configured to decode the input data based on a first number of parity bits; and the second FEC decoder is configured to decode the decoded input based on a second number of parity bits that is less than the first number of parity bits.

5. The system of claim 1, wherein the fiber-optic interface unit and the host unit are configured such that the fiber optic interface is pluggable to the transceiver.

6. The system of claim 1, wherein the first FEC decoder includes a soft-decision input low density parity check code (LDPC) decoder.

7. The system of claim 6, wherein the soft-decision input LDPC decoder includes one from a soft-decision input Min-Sum LDPC decoder and a soft-decision input Belief-Propagation LDPC decoder.

8. The system of claim 1, wherein the second FEC decode is a hard-decision input low density parity check code (LDPC) decoder.

9. The system of claim 8, wherein the hard-decision input LDPC decoder includes one from a hard-decision input Bit-Flip LDPC decoder and a hard-decision input Min-Sum LDPC decoder.

10. The system of claim 1, wherein the first FEC decoder is to correct an error from an external interface.

11. The system of claim 1, wherein the second FEC is to correct an error from a local interface between the fiber-optic interface unit and host unit.

12. A system for a fiber-optic network, comprising:
a transceiver including:
a fiber-optic interface unit including a first forward error correction (FEC) decoder being configured to send decoded data to a host unit with a second FEC decoder, wherein the fiber-optic interface unit includes a Physical Media Dependent (PMD) device, wherein the host unit includes a TC/MAC device.

13. The system of claim 12, wherein the second FEC decoder is configured to receive input data decoded by the first FEC decoder from the fiber-optic interface unit.

14. The system of claim 12, wherein the first FEC decoder is to correct an error from an external interface, wherein the second FEC is to correct an error from a local interface between the fiber-optic interface unit and host unit.

15. A system for a fiber-optic network, comprising:
a transceiver including:
a host unit including a first forward error correction (FEC) decoder being configured to receive input data decoded by a second FEC decoder of a fiber-optic interface unit, wherein the fiber-optic interface unit includes a Physical Media Dependent (PMD) device, wherein the host unit includes a TC/MAC device.

16. The system of claim 15, wherein the first FEC decoder is to correct an error from an external interface, wherein the second FEC is to correct an error from a local interface between the fiber-optic interface unit and host unit.

* * * * *